US006707348B2

(12) United States Patent
Ammar

(10) Patent No.: US 6,707,348 B2
(45) Date of Patent: Mar. 16, 2004

(54) MICROSTRIP-TO-WAVEGUIDE POWER COMBINER FOR RADIO FREQUENCY POWER COMBINING

(75) Inventor: Danny F. Ammar, Windermere, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 10/218,669

(22) Filed: Aug. 14, 2002

(65) Prior Publication Data

US 2003/0197572 A1 Oct. 23, 2003

Related U.S. Application Data

(60) Provisional application No. 60/374,712, filed on Apr. 23, 2002.

(51) Int. Cl.[7] .......................... H01P 5/103; H01P 5/12; H03H 5/00

(52) U.S. Cl. .......................................... 333/26; 333/125

(58) Field of Search ........................... 333/26, 33, 125, 333/248; 330/66; 343/705

(56) References Cited

U.S. PATENT DOCUMENTS 4,761,654 A 8/1988 Zaghloul
4,825,175 A 4/1989 Tsuda et al.
4,870,375 A 9/1989 Krueger, Jr. et al.
4,943,809 A 7/1990 Zaghloul
5,136,304 A 8/1992 Peters
5,202,648 A * 4/1993 McCandless ................ 333/26
5,214,394 A 5/1993 Wong
5,329,248 A 7/1994 Izadian
5,376,901 A * 12/1994 Chan et al. ................... 333/33
5,724,049 A * 3/1998 Park et al. .................. 343/705
5,912,598 A * 6/1999 Stones et al. ................. 333/26
6,040,739 A * 3/2000 Wedeen et al. ............... 330/66
6,509,809 B1 * 1/2003 Lynch ......................... 333/26
6,549,106 B2 * 4/2003 Martin ....................... 333/248

FOREIGN PATENT DOCUMENTS

EP 0 249 310 12/1987
EP 0 458 226 11/1991
EP 0 599 316 6/1994
WO 00/38272 6/2000

* cited by examiner

*Primary Examiner*—Patrick Wamsley
(74) *Attorney, Agent, or Firm*—Allen, Dyer, Doppelt, Milbrath & Gilchrist, P.A.

(57) ABSTRACT

A microstrip-to-waveguide power combiner includes a dielectric substrate and at least two microstrip transmission lines formed thereon in which radio frequency signals are transmitted. The microstrip transmission lines terminate in microstrip launchers or probes at a microstrip-to-waveguide transition. A waveguide opening is positioned at the transition. A waveguide back-short is positioned opposite the waveguide opening at the transition. Isolation vias are formed within the dielectric substrate and around the transition and isolate the transition. A coaxial-to-waveguide power combiner is also disclosed.

21 Claims, 11 Drawing Sheets

MICROSTRIP-TO-WAVEGUIDE POWER COMBINER FOR RADIO FREQUENCY POWER COMBINING

RELATED APPLICATION

This application is based upon prior filed now abandoned provisional application Serial No. 60/374,712 filed Apr. 23, 2002.

FIELD OF THE INVENTION

This invention relates to power combining radio frequency signals, and more particularly, this invention relates to a power combining network for combining radio frequency signals using microstrip and waveguide circuits.

BACKGROUND OF THE INVENTION

Power combining techniques for radio frequency signals, including millimeter wavelength signals, have been accomplished in either a waveguide circuit or in a microstrip circuit. For example, prior art waveguide combining has been accomplished by feeding two or more signals in phase into a waveguide combiner. Although this type of power combining is efficient, the summing network is generally bulky and requires very high precision components. Microstrip power combining circuits have been accomplished by summing signals using a hybrid combiner circuit or a Wilkinson power summer circuit as known to those skilled in the art. This type of power combining circuit is more simple to implement in practice, but generally has higher losses.

FIG. 1 illustrates a typical waveguide combiner 20, widely available in the industry, and traditionally used to combine radio frequency signals from two sources of RF power. The combiner 20 can be formed from different materials as known to those skilled in the art, and generally has two input ports 22 that are bolted or fastened by other techniques to respective waveguide sources. The signals combine and are summed at the output port 24. This combiner 20 provides a reliable method of adding radio frequency energy, but requires careful phase matching of two radio frequency inputs and precisely control over the length of the two waveguide sides 26. The precision requirements for this waveguide and the requirement for a metal coating on the inside surface of the waveguide to achieve low losses results in relatively expensive devices. Also, this waveguide combiner is usually bulky, as illustrated, and occupies a significant amount of space.

FIGS. 2–4 show typical microstrip power combiners formed from microstrip transmission lines. These type of combiners are widely used in the industry for combining radio frequency power in microstrip circuits. There are primarily two types of microstrip combiners, using Wilkinson and hybrid circuits, as shown in the schematic circuit diagrams of FIGS. 2 and 3, respectively. The Wilkinson combiner 30 shown in FIG. 2 is a reflective combiner and includes two inputs 32, an output 34, and the Wilkinson circuit 36 that has a resistor for circuit balance as known to those skilled in the art. The hybrid combiner 40 shown in FIG. 3 is absorptive and includes two inputs 42, an output 44, and load resistor 46, forming a four port hybrid combiner. FIG. 4 illustrates a plan view showing the microstrip transmission lines 48 forming the circuit. In the hybrid combiner 40, the load resistor 46 absorbs any reflected energy because of mismatch. Typically, the three decibel (dB) Wilkinson combiner 30 results in 0.5 dB loss, while the hybrid combiner 40 results in 0.8 dB losses. These combiners provide a reliable method of RF energy summing and can be used in a very small space.

Other examples of various types of combiners and different RF coupling systems are disclosed in U.S. Pat. Nos. 4,761,654; 4,825,175; 4,870,375; 4,943,809; 5,136,304; 5,214,394; and 5,329,248.

As is also known to those skilled in the art, in a waveguide-to-coaxial line connector, a maximum energy field is in the center of the waveguide. An extension of a center conductor can be located at the point of a maximum energy field and act as an antenna to couple energy from a coaxial line into a waveguide. Coupling from a coaxial line to a waveguide could be achieved by using a loop, which couples two magnetic fields. In a prior art waveguide circuit using stripline or microstrip, the center conductor of a stripline can be extended into a waveguide forming a probe (or launcher). By increasing the width of a center conductor at the end of a probe, bandwidth can be improved. Also, the conductor and substrate of a microstrip circuit, but not a ground plane, can be extended directly into a guide.

In a prior art coaxial line circuit using a microstrip connection, the center conductor of a coaxial line can be pressed against or soldered to a conductor of a microstrip. The outer conductor of a coaxial line can be grounded to a microstrip ground plane. The microstrip substrate thickness could be as little as 0.010 inch for frequencies above 15 GHz, and usually requires decreasing the diameter of the coaxial line. In yet other types of systems, various directional couplers have waveguides that are located side-by-side or parallel to each other, or crossing each other. Stripline and microstrip couplers can have main transmission lines in close proximity to secondary lines Although these examples can provide some power combining and coupling, they are not useful for combining two or more sources of radio frequency energy in a microstrip-to-waveguide transition with low losses or small “real estate” at an efficient rate at low power loss.

SUMMARY OF THE INVENTION

It is therefore an object of the present invention to provide a microstrip-to-waveguide and a coaxial-to-waveguide power combiners that overcome the disadvantages of the prior art power combiners identified above and has low losses, small “real estate,” and is power efficient.

The present invention is advantageous and power combines radio frequency signals using a combination of microstrip and waveguide circuit techniques that result in very low losses. The combining network is compact and can be used at a low cost. In the present invention, two or more sources of radio frequency energy can be combined in a microstrip-to-waveguide transition resulting in low losses. Also, two or more sources of radio frequency energy in a microstrip-to-waveguide transition are combined and are not as sensitive to phase mismatch between the radio frequency sources as other power combine methods. The power combining is achieved efficiently at a low cost and is implemented in compact spaces. The method and apparatus of the present invention allows radio frequency power combining that can be implemented at any frequency where energy can be transferred over a waveguide.

In accordance with one aspect of the present invention, the microstrip-to-waveguide power combiner includes a dielectric substrate and at least two microstrip transmission lines formed thereon in which amplified radio frequency signals are transmitted. The at least two microstrip transmission lines terminate in microstrip launchers (probes) at a microstrip-to-waveguide transition. A waveguide opening is positioned at the transition. The waveguide back-short is positioned opposite the waveguide opening at the transition. Isolation/ground vias are formed within the dielectric substrate and positioned around the transition to isolate the transition and provide a ground well. The radio frequency signals can be millimeter wavelength radio frequency signals.

In yet another aspect of the present invention, a metallic plate supports the dielectric substrate. A back-short cavity is formed within the metallic plate at the transition to form the waveguide back-short. This back-short cavity has a depth ranging from about 25 to about 60 mils and its overall dimensions are about the size of the waveguide opening. The back-short is positioned for reflecting energy into the waveguide opening.

In yet another aspect of the present invention, each microstrip transmission line has a power amplifier associated therewith and supported by the dielectric substrate. The phase of each power amplifier is adjusted based on the location of microstrip launchers or probes at the transition. The number of microstrip launchers, in one aspect of the invention, can be either two or four and the respective phase of the power amplifiers is 180 degrees apart for two opposed microstrip launchers or 90 degrees apart for four microstrip launchers when positioned at 90 degree angles to each other. The power amplifiers comprise microwave monolithic integrated circuits (MMIC) in one aspect of the invention.

A method aspect of the present invention is also disclosed for power combining radio frequency signals by combining two or more amplified radio frequency signals at a microstrip-to-waveguide transition that is formed from a dielectric substrate having at least two microstrip transmission lines thereon in which radio frequency signals are transmitted. The transition includes a waveguide opening and a waveguide back-short positioned opposite the waveguide opening. Each microstrip transmission line has a microstrip launcher or probe extending into the transition. Isolation vias are formed within the dielectric substrate around the transition and isolate the transition and provide a ground well around the transition.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous and power combines radio frequency signals using a combination of microstrip and waveguide or coax and waveguide techniques that result in very low losses. The power combining network of the present invention is extremely compact and can be used at a very low cost. In the present invention, two or more sources of radio frequency energy can be combined in a microstrip-to-waveguide or coax-to-waveguide transitions resulting in extremely low losses. Also, two or more sources of radio frequency energy are combined in microstrip-to-waveguide transition and are not as sensitive to phase mismatch between the radio frequency sources as other methods of power combining. The power combining is achieved efficiently at a low cost and is implemented in compact spaces. The method and apparatus of the present invention allow RF power combining that can be implemented at any frequency where energy can be transferred over a waveguide.

Figure 1:
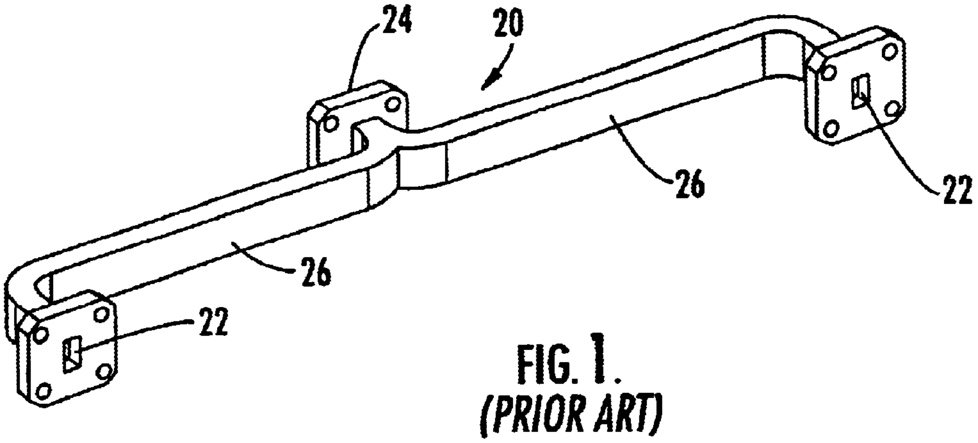
FIG. 1. (PRIOR ART)
FIG. 1 is an isometric view of a prior art waveguide combiner.
Figure 2:
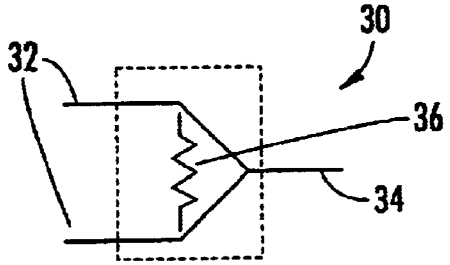
FIG. 2. (PRIOR ART)
FIG. 2 is a schematic circuit diagram of a prior art microstrip power combiner as a Wilkinson combiner.
Figure 3:
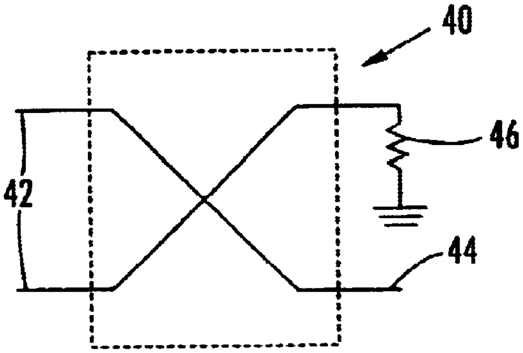
FIG. 3. (PRIOR ART)
FIG. 3 is a schematic circuit diagram showing a prior art, four-port hybrid power combiner.
Figure 4:
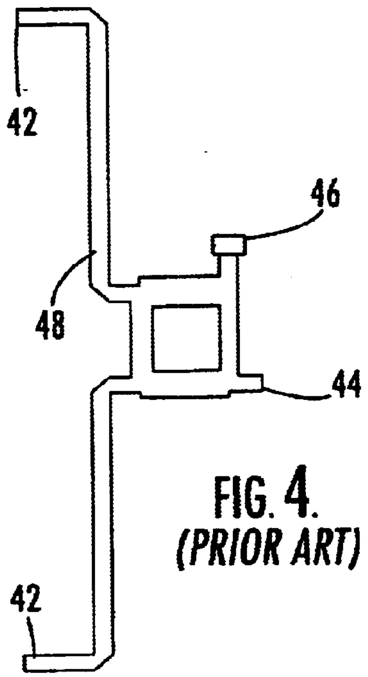
FIG. 4. (PRIOR ART)
FIG. 4 is a plan view of the four-port hybrid power combiner shown in FIG. 3.
Figure 4A:
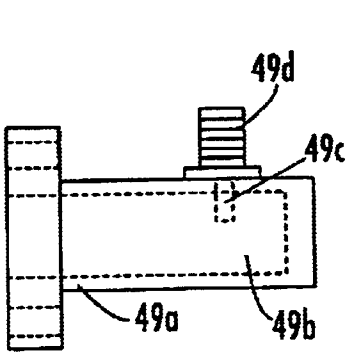
FIGS. 4A and 4B are respective side elevation and front views of a coaxial-to-waveguide transition of the general type that could be used as modified by the present invention for power combining.
Figure 4B:
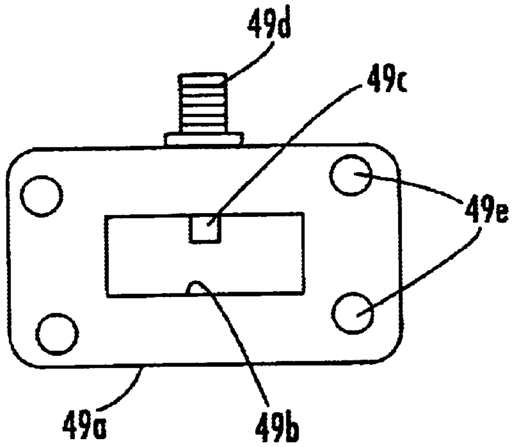

FIGS. 4A and 4B illustrate respective side and front views of a coaxial-to-waveguide transition 49' of the general type that can be modified and used with the present invention, including a coaxial cable support body 49*a*, formed back short 49*b*, a single launch probe 49*c* and coaxial connector 49*d*. Through holes (or screw holes) 49*e* provide means for receiving screws or other attachment fasteners (not shown) as known to those skilled in the art. This type of transition is widely used in the industry and has a 0.25 to 0.5 dB loss.

Figure 5:
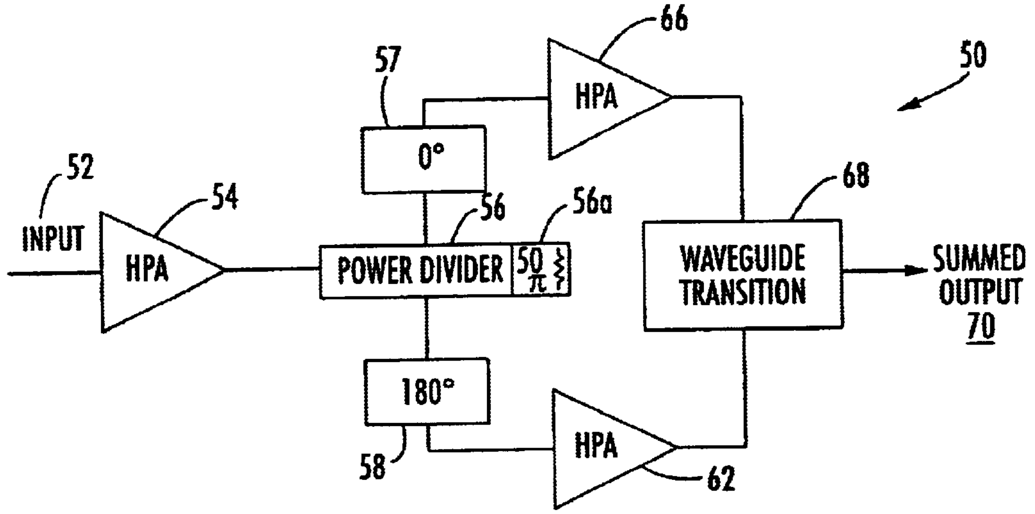
FIG. 5 is a block diagram of a microstrip-to-waveguide power combiner of the present invention and showing two sources of radio frequency energy.

FIG. 5 illustrates a block diagram of a microstrip-to-waveguide power combiner 50 of the present invention showing two sources of radio frequency energy. As illustrated, a microstrip transmission line input 52 enters a high power amplifier 54 that can be formed as a microwave monolithic integrated circuit (MMIC). The signal passes over a microstrip transmission line to a microstrip rat race power divider 56, having a 50 ohm terminating resistor 56*a* as a value typically chosen by many skilled in the art as a complement for 50 ohm microstrip transmission lines. A zero degree (0°) phase shift circuit 57 and a 180 degree phase shift circuit 58 are provided in one microstrip transmission line 60 that extends from the power divider 56 to another high power amplifier 62. The other microstrip transmission line 64 extends from the power divider into another high power amplifier 66 to a microstrip-to-waveguide transition 68 of the present invention and into a summed output 70.

Figure 6:
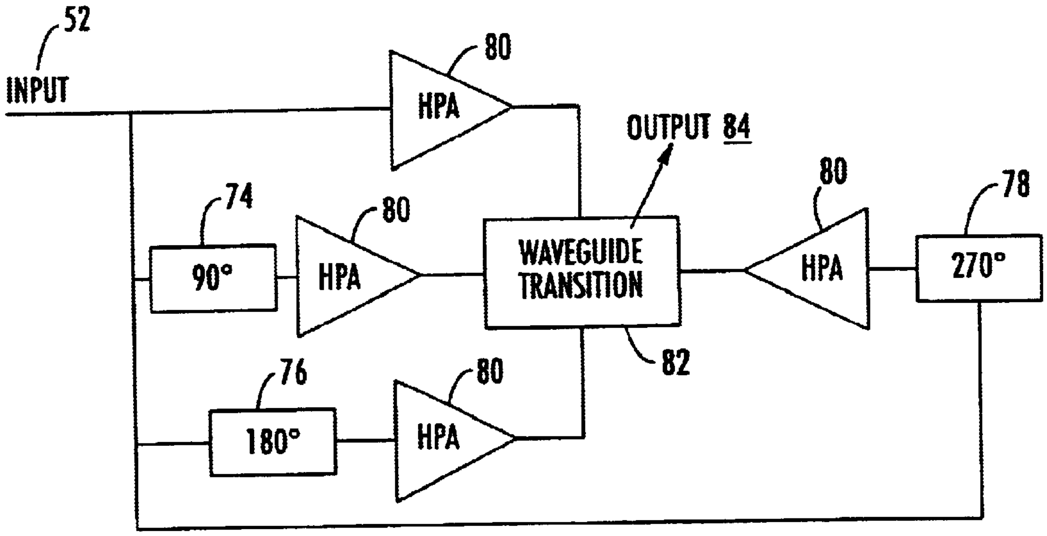
FIG. 6 is another block diagram of a microstrip-to-waveguide combiner of the present invention and showing four sources of radio frequency energy.

FIG. 6 is another block diagram of a microstrip-to-waveguide power combiner 72 similar to FIG. 5, but instead showing four sources of radio frequency energy with respective 90 degree, 180 degree and 270 degree phase shift circuits 74, 76, 78 associated with microstrip transmission lines and high power amplifiers 80 that extend into the microstrip-to-waveguide transition 82 of the present invention. A summed output 84 is illustrated. Power is combined with no additional losses other than normal transition loss, usually resulting in about 0.25 to about 0.3 decibel (dB) loss. The present invention can achieve the same outcome as a waveguide combiner using extremely low losses, but requires no external waveguide combiner. This is advantageous where real estate is an issue.

Figure 7:
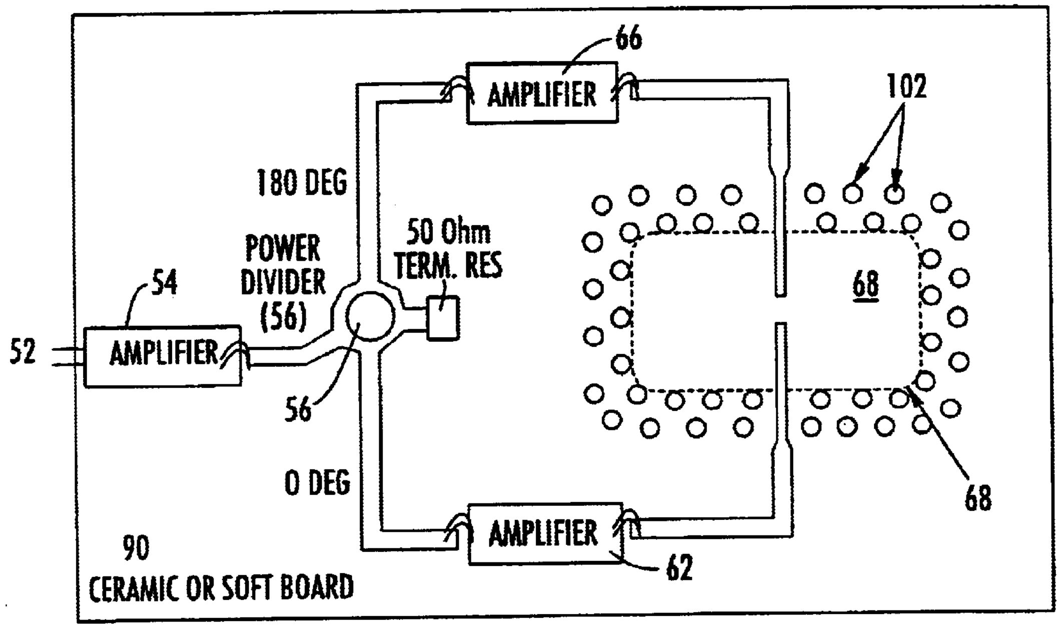
FIG. 7 is a plan view of a power combiner using two sources of radio frequency energy, such as shown in FIG. 5.
Figure 8A:
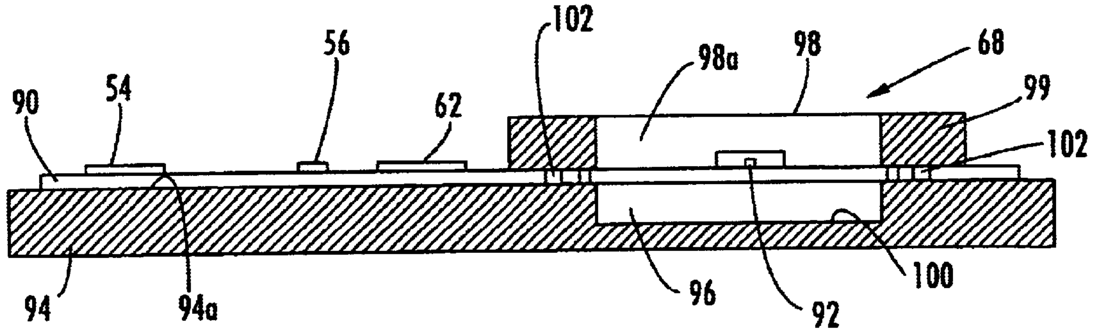
FIG. 8A is a fragmentary, side sectional view of the power combiner shown in FIG. 7.

FIGS. 7 and 8A are respective plan and fragmentary side elevation views of a power amplifier, such as shown in FIG. 5. The power amplifiers 54, 62, 66 are illustrated as preferably formed as microwave monolithic integrated circuits (MMIC) and connected to the respective microstrip transmission lines 60, 64. As illustrated, a dielectric substrate 90 has the at least two microstrip transmission lines 60, 64 formed thereon in which radio frequency signals are transmitted. These microstrip transmission lines 60, 64 terminate in opposed microstrip launchers 92, also referred to as probes, at the microstrip-to-waveguide transition 68 (shown in dashed line). The dielectric substrate 90 can be formed from a ceramic substrate or other similar soft board material, including alumina, as known to those skilled in the art.

A metal base plate 94, such as formed from aluminum or other similar material, supports the dielectric substrate, and may include ground layer 94 a interposed between the dielectric and metal plate. A waveguide back-short 96 is positioned opposite a waveguide opening 98. Both are positioned at the transition 68. The waveguide opening is formed in a waveguide support plate or top metal cover as illustrated at 99 or other structure as known to those skilled in the art. The waveguide opening 98 forms a waveguide launch 98*a*. A back-short cavity 100 is formed within the metal plate 94 at the transition to form the waveguide back-short 96. This back-short cavity 100 has a depth ranging from about 25 to about 60 mils and is positioned for reflecting energy into the waveguide opening. The waveguide back-short is dimensioned about the size of the transition in one aspect of the present invention.

Figure 9:
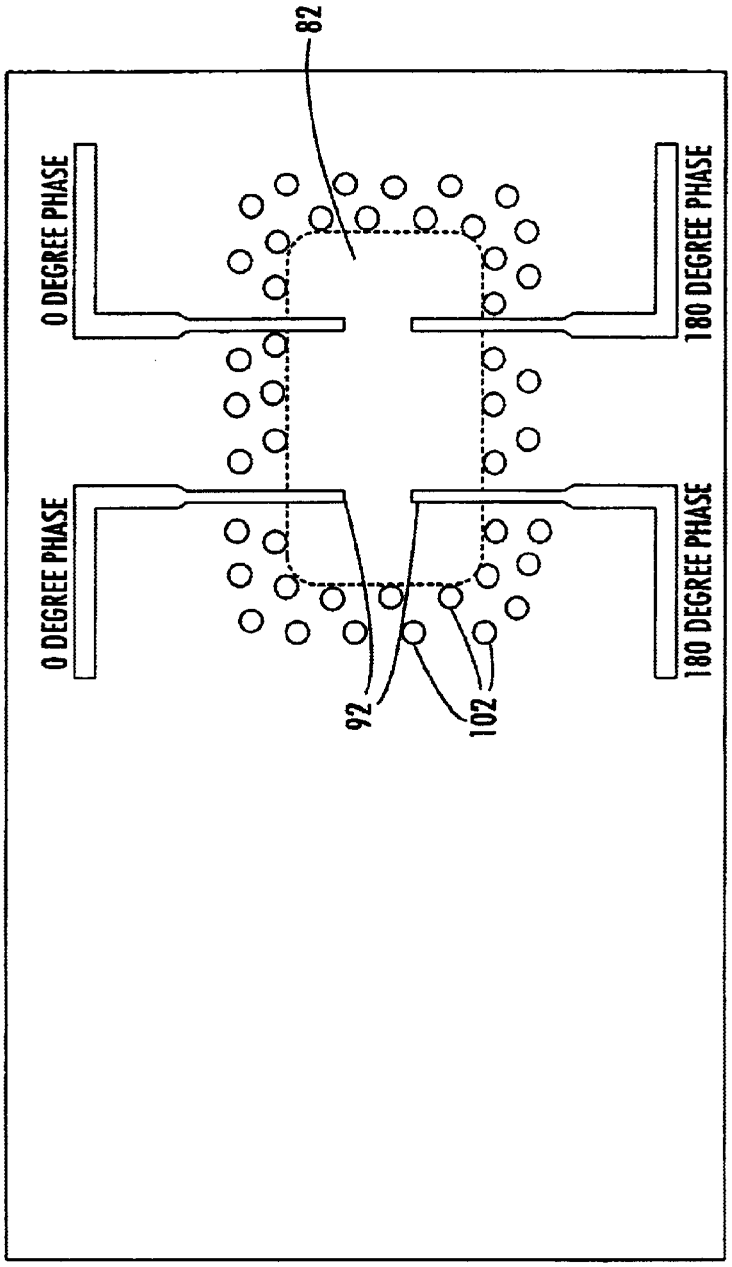
FIG. 9 is a fragmentary plan view of a microstrip-to-waveguide power combiner having four sources of radio frequency energy and showing a microstrip-to-waveguide transition and four microstrip launchers.

FIG. 8A shows the probe or microstrip launcher 92 positioned relative to the microstrip opening 98 and formed waveguide launch 98*a*. As illustrated in FIGS. 7 and 9, isolation/ground vias 102 are formed in at least the dielectric substrate 90 and around the transition 68 to isolate the transition and form a well around the transition.

As illustrated, the power amplifiers 54, 62, 66 are formed as MMIC chips or other amplifiers and associated with respective microstrip transmission lines. The power amplifiers have a phase that is adjusted based on the location of microstrip launchers (probes) 92 at the transition 68. For example, in the example of FIGS. 7 and 8 as shown in the schematic circuit diagram of FIG. 5, two microstrip launchers 92 are opposed to each other, i.e., positioned 180 degrees apart, and the power amplifiers are phase adjusted for 180 degrees.

Figure 8B:
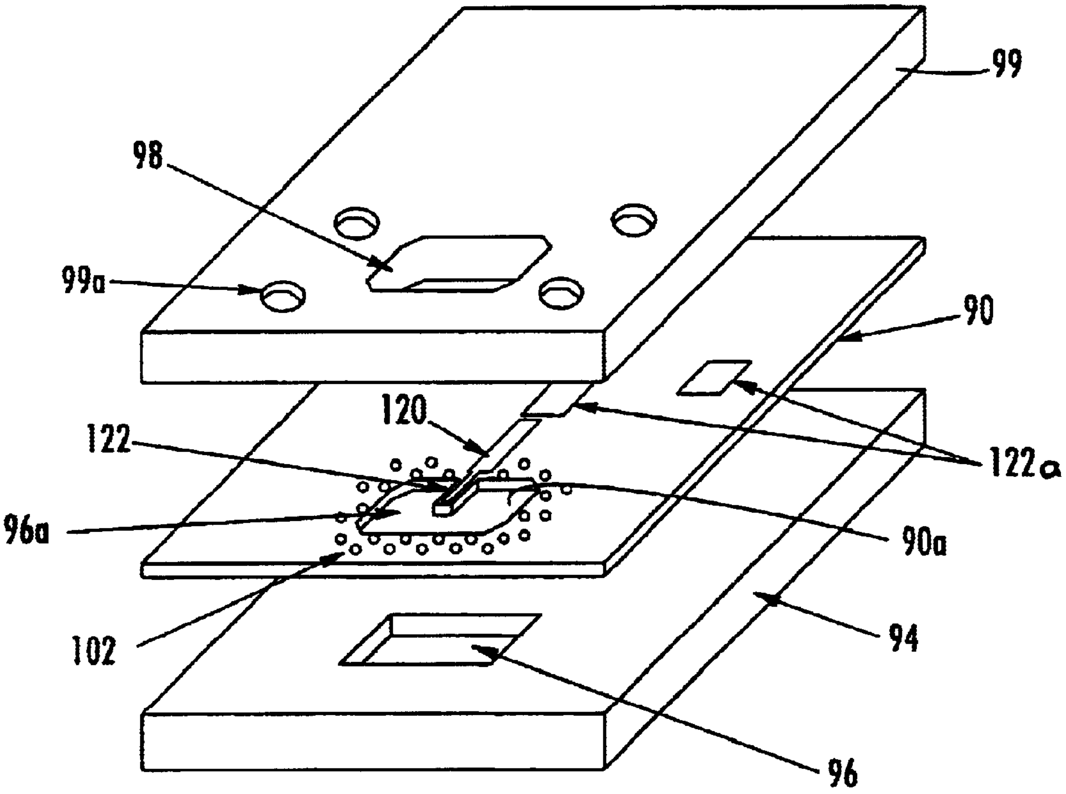
FIG. 8B is an exploded isometric view of a microstrip-to-waveguide transition of the general type that can be used in the present invention.

FIG. 8B illustrates an exploded isometric view of a microstrip-to-waveguide transition with a single microstrip transmission line 120 forming a probe 122. This type of transition as modified can be used for the present invention and is illustrated for explanation. Similar elements as in the previously described elements will continue with similar reference numerals for purposes of clarity. The back short 96 is illustrated within the metal base plate 94 and forms a cavity for the air or dielectric material 96*a* as part of the "cut-out" opening 90*a* within the ceramic or other dielectric material 90. A waveguide opening 98 is formed in the top metal cover 99 and includes screw holes 99*a* for receiving screws or other fasteners for fastening the top metal cover, ceramic (or other dielectric material) and base metal plate together in one integral piece. The ground vias 102 are illustrated as formed around the "cut-out" 90*a* where the "probe" or microstrip launchers 122 extend thereon. Electronic or MMIC components 122*a* are shown mounted on the ceramic or other dielectric material and are operable with the microstrip transmission line 120 and other components.

Figure 8C:
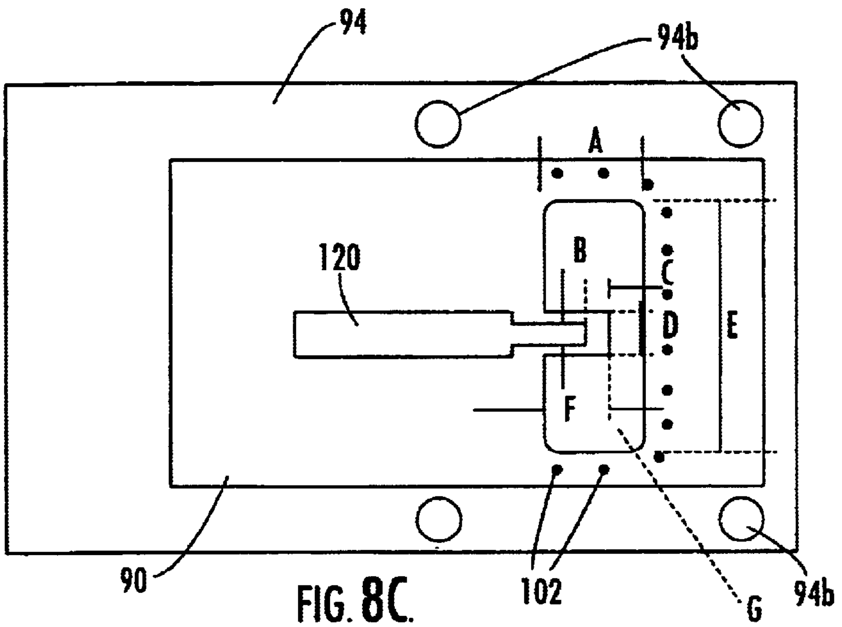
FIGS. 8C and 8D are respective fragmentary top and side elevation views of a microstrip-to-waveguide transition of the type as shown in FIG. 8B.
Figure 8D:
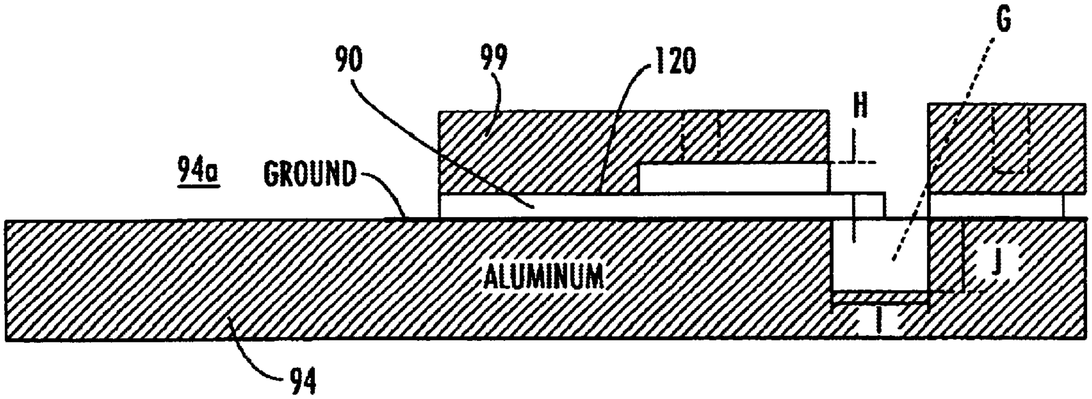

FIGS. 8C and 8D illustrate respective top and side elevation views of a waveguide-to-microstrip transition such as the type shown in FIG. 8D to show greater details of its construction, and showing a 50 ohm microstrip transmission line 120 and the flange holes 94*b* formed in the aluminum base plate 94 and the ground layer 94*a* supported under the ceramic or other dielectric material 90. In one aspect of the present invention, the dielectric material is formed as a 10 mil alumina 99.9% with k=9.9. The ground vias are shown in a semi-circle, but in the preferred aspect of the present invention such as shown in FIGS. 5–7 and 9–11, the ground vias circumferentially extend around the back short.

For purposes of description, various dimensions are set forth only as representative capital letters shown in FIGS. 8C and 8D are examples of dimensions.

| | |
|---|---|
| A ≅ | 0.14 |
| B ≅ | 0.006 |
| C ≅ | 0.010 |
| D ≅ | 0.04 |
| E ≅ | 0.32 |
| F ≅ | 0.075 |
| G preferred not to exceed ≅ | 0.070 |
| H ≅ | 0.080 |
| I ≅ | 0.140 |
| J ≅ | 0.063 |

Although dimensions can vary, these are only one example of the type of dimensions that could be used for microstrip-to-waveguide transition.

Figure 10:
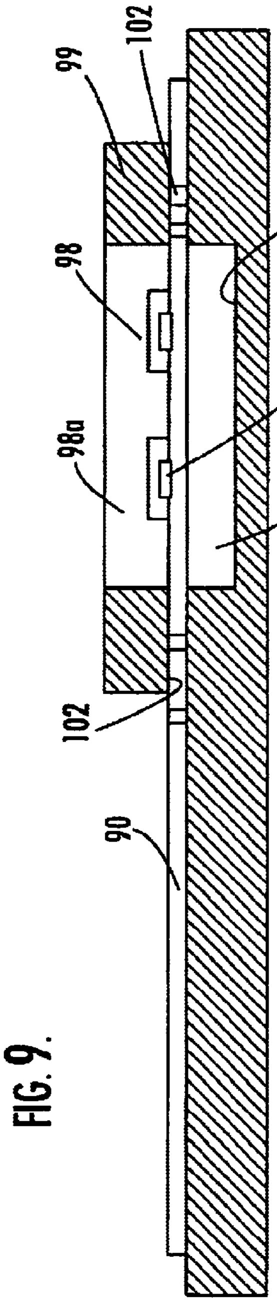
FIG. 10 is a fragmentary, side sectional view of the microstrip-to-waveguide transition of FIG. 9.

FIGS. 9 and 10 show another example of a power combiner of the present invention, but showing four microstrip launchers having different phase differences as associated with respective power amplifiers (not shown in the figures) in the type of circuit such as shown in FIG. 6. The power combiners shown in FIGS. 9 and 10 have a similar structure using the dielectric substrate and back-short construction, such that similar reference numerals correspond to similar elements. One difference between the different constructions is that four microstrip launchers or probes are used as illustrated in FIGS. 9 and 10.

Figure 11:
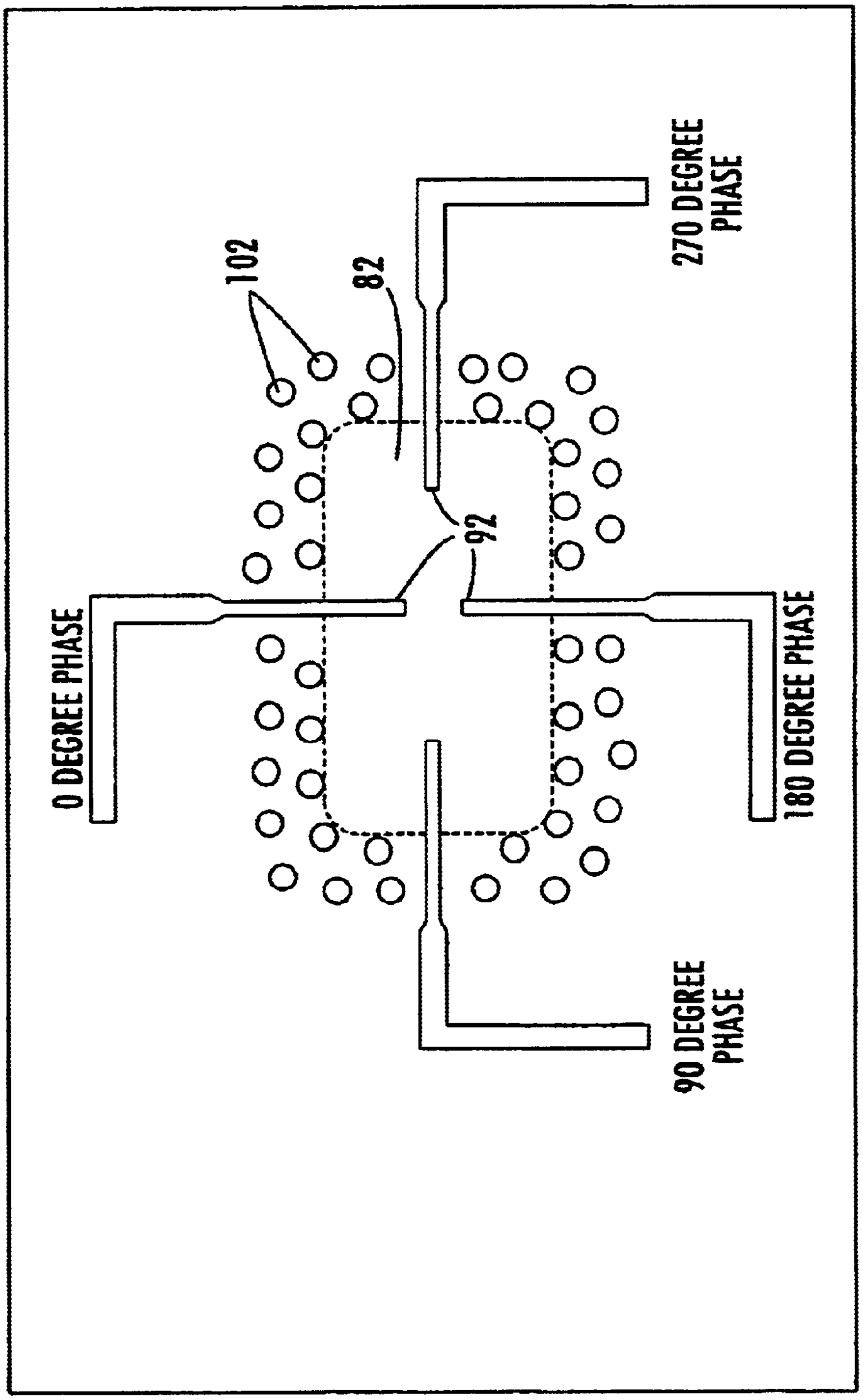
FIG. 11 is a plan view of another microstrip-to-waveguide transition similar to FIG. 9, but showing a configuration where the microstrip launchers are positioned 90 degrees relative to each other.

FIG. 11 is another example showing the microstrip launchers positioned 90 degrees apart from each other such that respective power amplifiers would be phased 90 degrees apart for the four microstrip launchers, as illustrated.

Figure 11A:
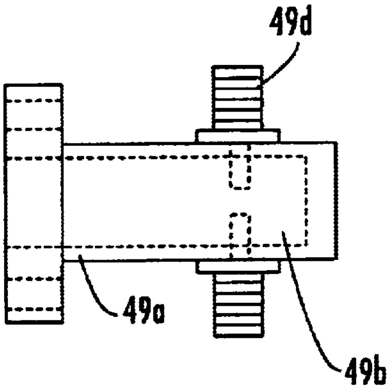
FIGS. 11A and 11B are respective side elevation and front views of a coaxial-to-waveguide transition and power combiner.
Figure 11B:
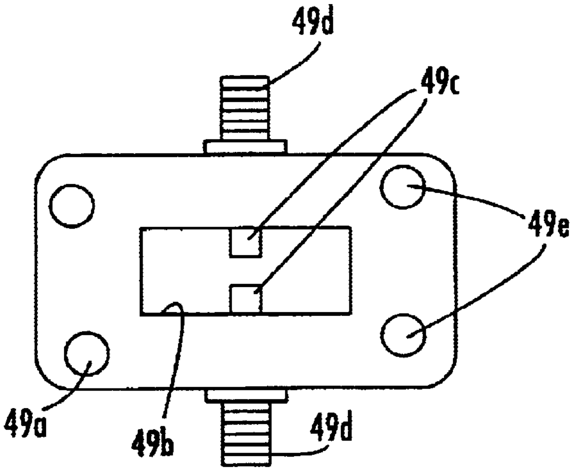

FIGS. 11A and 11B are respective side and front views of a coaxial-to-waveguide 2:1 power combiner with elements similar to those shown in FIGS. 4A and 4B. Two launch probes 49*c* are opposed to each other. Otherwise, similar elements are used as before, except modified for power combining as would be suggested by those skilled in the art.

In operation, the back-short 96 has the formed cavity 100 where energy is reflected and exits from its opposite end into a waveguide. The isolation vias 102 help in the reflection of energy. The depth of the back-short, in one aspect, is about 25 to about 60 mils deep, but its depth could be a function of many parameters, including the dielectric constant of the dielectric material 90 (or soft board) and a function of the bandwidth and/or what a designer and one skilled in the art is attempting to achieve. The back-short 96 is typically about the size of the transition 68 and can be on the bottom or on top. If a designer is trying to transmit energy off the bottom, the back-short could be placed on top (basically upside down). If energy is propagated up into a waveguide, then the back-short is placed on the bottom as illustrated.

Figure 12:
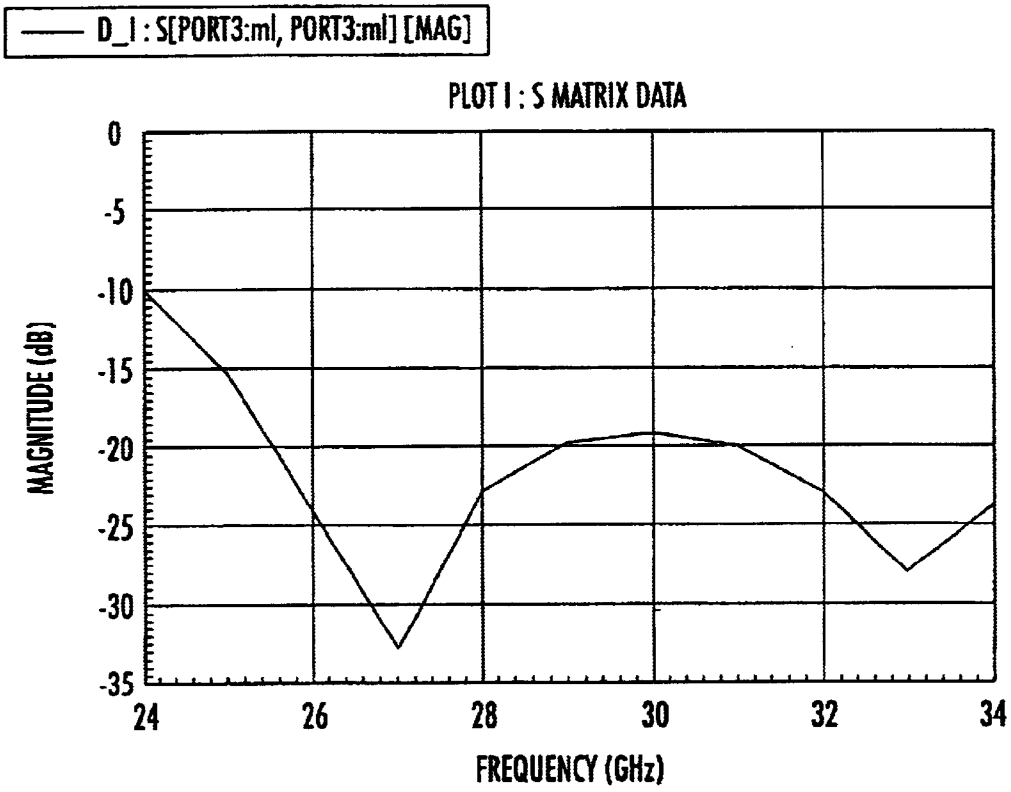
FIG. 12 is a graph illustrating a microstrip-to-waveguide combiner return loss of the present invention as a non-limiting example.

FIG. 12 is a graph of the predicted (using electromagnetic simulation) return loss for a 2:1 ka-band power combiner as set forth above. This graph illustrates that the combiner bandwidth (return loss less than −20 decibels) is well over 30%, which is broad for this frequency.

Figure 13:
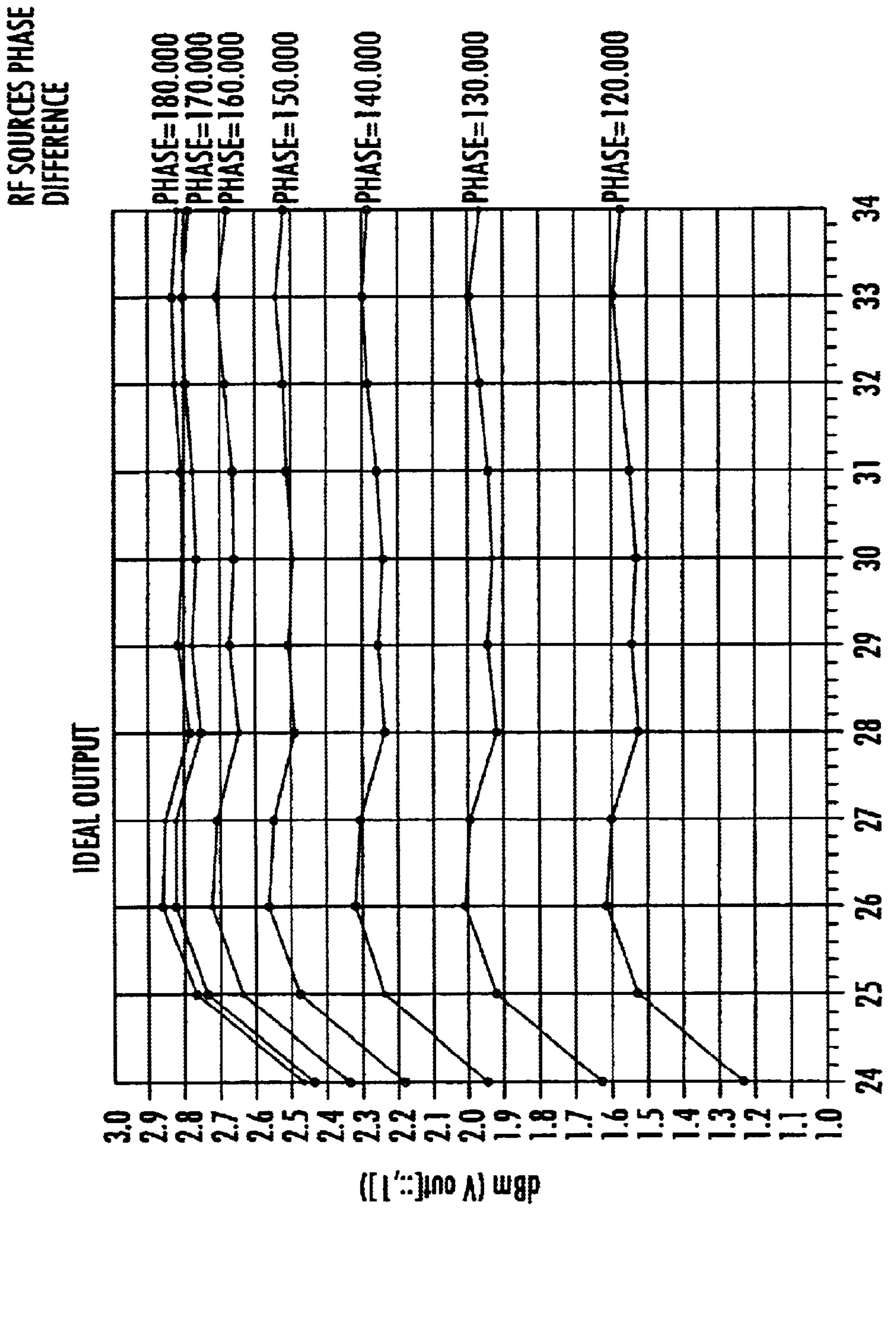
FIG. 13 is another graph illustrating a power combiner sensitivity to radio frequency source phase mismatch, in accordance with one example of the present invention.

FIG. 13 illustrates a graph of the power combiner gain and transition loss versus phase mismatch between two radio frequency sources. This graph illustrates that the total transition and power combiner losses is under 0.25 decibels with perfect phasing and degrades to about 0.5 decibel loss with +/−30 degree phase mismatch. The typical microstrip-to-waveguide transition losses, without power combining, are about 0.25 decibels to about 0.5 decibels. Therefore, the power combining can be performed in accordance with the present invention with no additional losses.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A microstrip-to-waveguide power combiner comprising:

at least two amplified radio frequency signals phase adjusted to each other;

a dielectric substrate;

a microstrip-to-waveguide transition;

at least two microstrip transmission lines formed on the substrate in which the amplified radio frequency signals are transmitted and each terminating in a microstrip launcher probe at the transition;

a waveguide opening positioned at the transition and forming a single waveguide launch;

a waveguide back-short positioned opposite the waveguide opening at the waveguide launch formed by the transition; and isolation/ground vias formed within the dielectric substrate and around the waveguide launch formed by the transition that isolates the waveguide launch wherein the at least two amplified and phase adjusted radio frequency signals are summed at the single waveguide launch.

2. A microstrip-to-waveguide power combiner according to claim 1, and further comprising a metallic plate on which said dielectric substrate is secured, and a back-short cavity formed within the metallic plate at the transition to form the waveguide back-short.

3. A microstrip-to-waveguide power combiner according to claim 2, wherein the back-short cavity has a depth ranging from about 25 to about 60 mils.

4. A microstrip-to-waveguide power combiner according to claim 2, wherein the waveguide back-short is positioned for reflecting energy into the waveguide opening.

5. A microstrip-to-waveguide power combiner according to claim 1, wherein the radio frequency signals comprise microwave or millimeter wavelength signals.

6. A microstrip-to-waveguide power combiner comprising:

a dielectric substrate;

a microstrip-to-waveguide transition formed thereon;

at least two microstrip transmission lines formed on the dielectric substrate in which radio frequency signals are transmitted and terminating in microstrip launcher probes at the microstrip-to-waveguide transition, each microstrip transmission line having a power amplifier associated therewith and supported by said dielectric substrate and phase adjusted to each other;

a waveguide opening positioned at the transition and forming a single waveguide launch;

a waveguide back-short positioned opposite the waveguide opening at the waveguide launch formed by the transition; and isolation/ground vias formed within the dielectric substrate and around the waveguide launch formed by the transition that isolates the waveguide launch wherein the amplified and phase adjusted radio frequency signals are summed at the single waveguide launch.

7. A microstrip-to-waveguide power combiner according to claim 6, wherein the phase of power amplifiers is adjusted based on the location of microstrip launchers at the transition.

8. A microstrip-to-waveguide power combiner according to claim 7, wherein the number of microstrip launchers is either two or four and the respective phase of said power amplifiers is 180 degrees or 90 degrees apart dependent on their location around the microstrip-to-waveguide transition.

9. A microstrip-to-waveguide power combiner according to claim 6, and further comprising a metallic plate on which said dielectric substrate is secured, and a back-short cavity formed within the metallic plate at the transition to form the waveguide back-short.

10. A microstrip-to-waveguide power combiner according to Claim 9, wherein the back-short cavity has a depth ranging from about 25 to about 60 mils.

11. A microstrip-to-waveguide power combiner according to claim 6, wherein the power amplifiers comprise microwave monolithic integrated circuits (MMIC).

12. A microstrip-to-waveguide power combiner according to claim 6, wherein the waveguide back-short is positioned for reflecting energy into the waveguide opening.

13. A method of power combining radio frequency signals comprising the steps of:

providing two or more amplified and phase adjusted radio frequency signals at a microstrip-to-waveguide transition that is formed from a dielectric substrate and at least two microstrip transmission lines formed thereon in which phase adjusted and amplified radio frequency signals are transmitted, wherein the transition includes a waveguide opening forming a single waveguide launch, a waveguide back-short positioned opposite the waveguide opening, each microstrip transmission line having a microstrip launcher probe extending into the waveguide launch formed by the transition, and isolation/ground vias formed within the dielectric substrate around the waveguide launch formed by the transition that isolate the waveguide launch; and power combining the at least two phase adjusted and amplified radio frequency signals into a summed output at the waveguide launch.

14. A method according to claim 13, and further comprising the step of amplifying each radio frequency signal at a power amplifier positioned on the dielectric substrate and associated with a respective microstrip transmission line.

15. A method according to claim 14, and further comprising the step of adjusting the phase of power amplifiers based on the location of microstrip launchers at the transition.

16. A method according to claim 13, wherein the radio frequency signals comprises millimeter wavelength signals.

17. A method according to claim 13, and further comprising the step of forming the waveguide back-short in a plate on which the dielectric substrate is secured.

18. A method according to claim 13, and further comprising the step of forming the waveguide back-short to a depth ranging from about 25 to about 60 mils.

19. A method according to claim 13, wherein the power amplifiers are formed as microwave monolithic integrated circuits (MMIC).

20. A method according to claim 13, and further comprising the step of positioning the waveguide back-short in a position for reflecting energy into the waveguide opening.

21. A method according to claim 13, and further comprising the step of connecting a coaxial connector to the transition.

* * * * *